US012696797B2

(12) United States Patent
Takehara et al.

(10) Patent No.: US 12,696,797 B2
(45) Date of Patent: Jul. 28, 2026

(54) ELECTRONIC DEVICES AND METHOD OF MANUFACTURING AN ELECTRONIC DEVICES

(71) Applicant: Amkor Technology Singapore Holding Pte. Ltd., Valley Point (SG)

(72) Inventors: Yasuyuki Takehara, Kanagawa (JP); Hidenari Sato, Oita (JP)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 995 days.

(21) Appl. No.: 17/939,684

(22) Filed: Sep. 7, 2022

(65) Prior Publication Data

US 2024/0079282 A1 Mar. 7, 2024

(51) Int. Cl.
| | |
|---|---|
| *H10W 76/47* | (2026.01) |
| *H10W 70/68* | (2026.01) |
| *H10W 74/01* | (2026.01) |
| *H10W 90/00* | (2026.01) |
| *H10W 72/00* | (2026.01) |
| *H10W 72/20* | (2026.01) |
| *H10W 72/50* | (2026.01) |
| *H10W 74/10* | (2026.01) |

(52) U.S. Cl.
CPC ........... *H10W 76/47* (2026.01); *H10W 70/68* (2026.01); *H10W 74/01* (2026.01); *H10W 90/00* (2026.01);
(Continued)

(58) Field of Classification Search
CPC ......... H01L 23/24; H01L 21/56; H01L 23/13; H01L 25/0655; H01L 25/50; H01L 23/3128; H01L 24/13; H01L 24/16; H01L 24/32; H01L 24/45; H01L 24/48; H01L 24/73; H01L 2224/13111; H01L 2224/13113; H01L 2224/13116; H01L 2224/13124; H01L 2224/13139; H01L 2224/13144; H01L 2224/13147; H01L 2224/16227; H01L 2224/32225; H01L 2224/32245; H01L 2224/45124; H01L 2224/45144; H01L 2224/45147; H01L 2224/48227; H01L 2224/73253;
(Continued)

(56) References Cited

U.S. PATENT DOCUMENTS

| | | | |
|---|---|---|---|
| 8,810,011 B2 * | 8/2014 | Pagaila | H01L 23/3121 |
| | | | 257/787 |
| 2016/0035680 A1 * | 2/2016 | Wu | H01L 23/552 |
| | | | 257/659 |

(Continued)

*Primary Examiner* — Jacob Y Choi
*Assistant Examiner* — Neil R Prasad
(74) *Attorney, Agent, or Firm* — Kevin B. Jackson

(57) ABSTRACT

In one example, an electronic device includes a substrate, which includes a substrate first side, a substrate second side opposite to the substrate side, a conductive structure, and a substrate opening extending through substrate from the substrate first side to the substrate second side. A pipe is coupled to the substrate first side and includes a pipe wall including an exterior surface and an interior surface defining a pipe passage aligned with the substrate opening, and a pipe top distal to the substrate first side. A electronic component is coupled to the conductive structure adjacent to the substrate first side. An encapsulant is over the substrate first side, the exterior surface of the pipe wall and over at least a portion of the electronic component. The pipe passage and the substrate opening are devoid of the encapsulant. Other examples and related methods are also disclosed herein.

20 Claims, 5 Drawing Sheets

(52) U.S. Cl.
CPC ...... *H10W 72/252* (2026.01); *H10W 72/5522*
(2026.01); *H10W 72/5524* (2026.01); *H10W*
*72/5525* (2026.01); *H10W 72/877* (2026.01);
*H10W 72/884* (2026.01); *H10W 74/117*
(2026.01); *H10W 90/724* (2026.01); *H10W*
*90/734* (2026.01); *H10W 90/736* (2026.01);
*H10W 90/754* (2026.01)

(58) Field of Classification Search
CPC ... H01L 2224/73265; H01L 2924/0132; H01L
2924/0133; H10W 76/47; H10W 90/00;
H10W 70/68; H10W 74/01; H10W
72/877; H10W 72/884; H10W 90/724;
H10W 90/754; H10W 72/5522; H10W
90/734; H10W 72/5524; H10W 72/5525;
H10W 74/117; H10W 90/736; H10W
72/252
See application file for complete search history.

(56) References Cited

U.S. PATENT DOCUMENTS

2017/0330839 A1* 11/2017 Kim ........................ H01L 23/04
2021/0193587 A1* 6/2021 Yada ..................... H01L 23/552

* cited by examiner

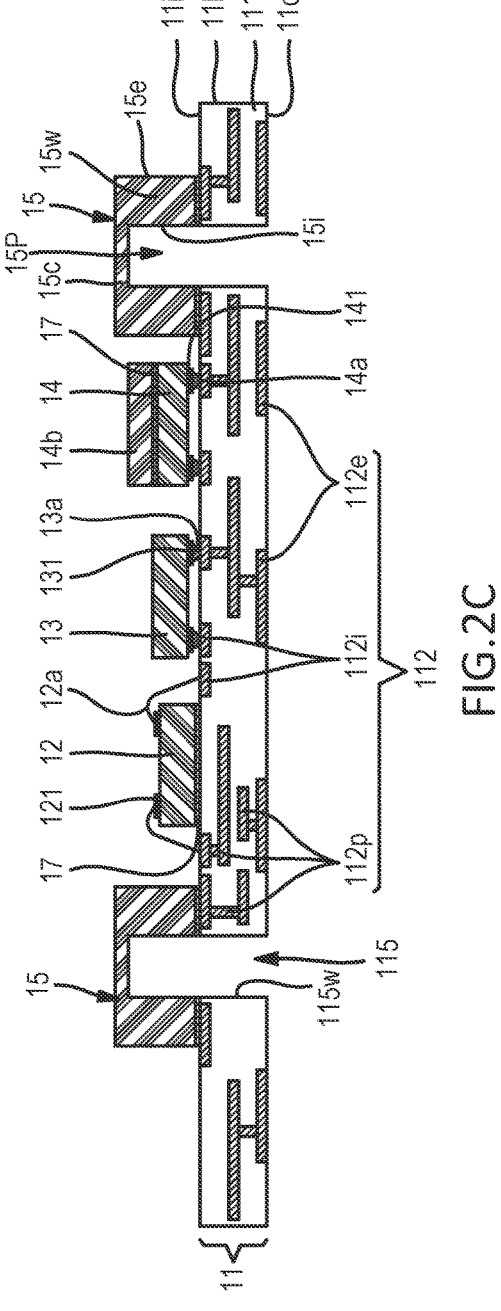
FIG.2C
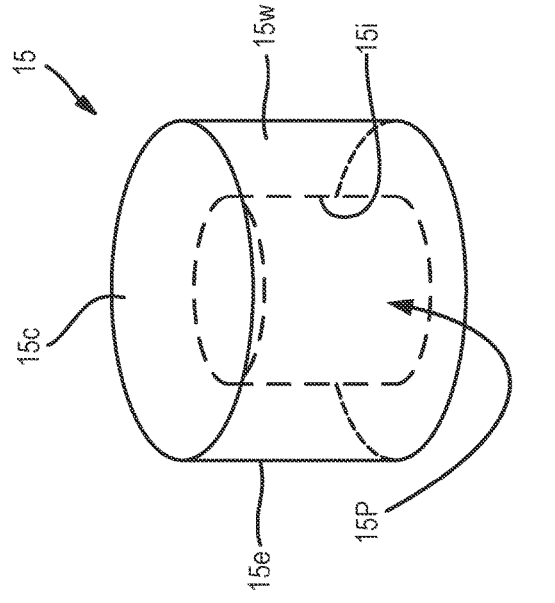
FIG.2C-A

ELECTRONIC DEVICES AND METHOD OF MANUFACTURING AN ELECTRONIC DEVICES

CROSS-REFERENCE TO RELATED APPLICATIONS

Not Applicable.

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, and 2F show cross-sectional views of an example method for manufacturing an example electronic device.

FIG. 2C-A shows a transparent perspective view of an example pipe structure for use in the method of FIGS. 2A to 2F.

Figure 1:
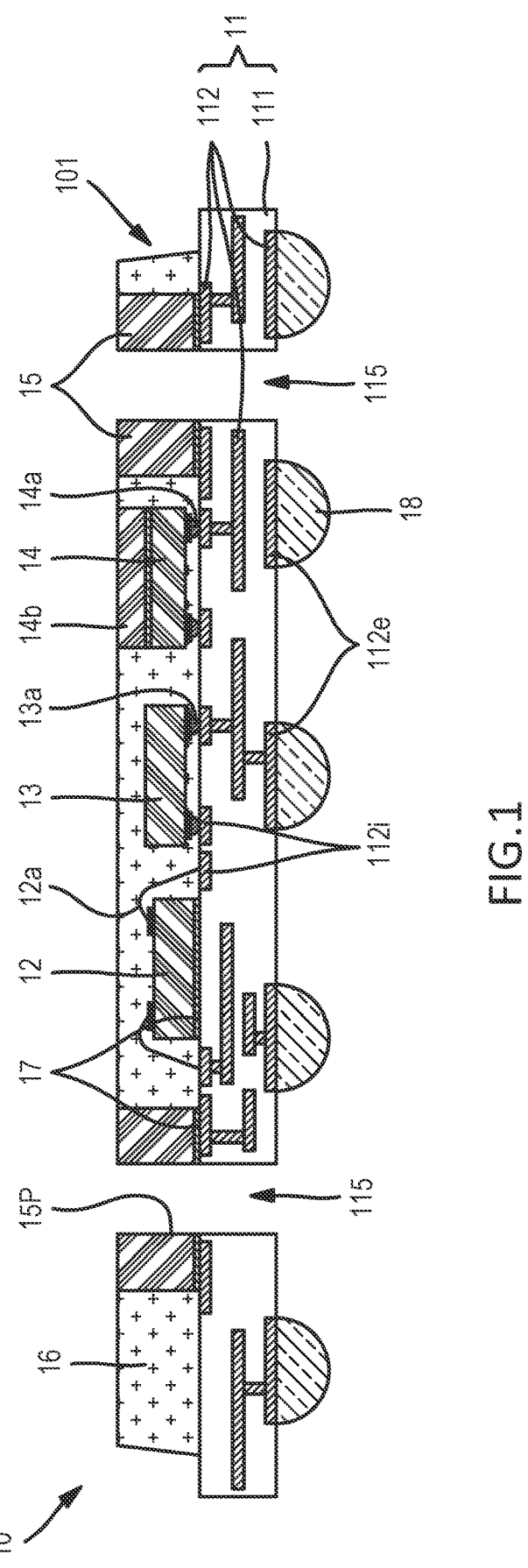
FIG. 1 shows cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. Crosshatching lines may be used throughout the figures to denote different parts but not necessarily to denote the same or different materials. Throughout the present disclosure, like reference numbers denote like elements. Accordingly, elements with like element numbering may be shown in the figures but may not be necessarily repeated herein for the sake of clarity.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. As used herein, the term coupled can refer to an electrical coupling or a mechanical coupling. Similarly, the terms "over" or "on" may be used to describe two elements directly contacting each other or describe two elements indirectly coupled by one or more other elements.

DESCRIPTION

The present description includes, among other features, structures and associated methods that relate to electronic devices with holes or passages for accommodating attachment structures used to attach the electronic device to other structures. In some examples, a capped pipe structure is provided over an opening in a package substrate before a protective structure, such as an encapsulant, is formed on the package substrate. Among other things, the capped pie structure prevents protective material from entering the opening while the protective structure is formed. In some examples, a portion of the protective material and the capped portion of the pipe can be removed to expose a passage through the pipe, which is aligned with the opening in the package substrate. The structures and methods avoid having to subsequently mechanically form a passage in the protective material and mechanically remove protective material from the opening in the package substrate. Among other things, this reduces manufacturing time and cost.

In an example, an electronic device includes a substrate, which includes a substrate first side, a substrate second side opposite to the substrate first side, a conductive structure, and a substrate opening extending through the substrate from the substrate first side to the substrate second side. A pipe is coupled to the substrate first side and includes a pipe wall including an exterior surface and an interior surface defining a pipe passage aligned with the substrate opening, and a pipe top distal to the substrate first side. A first electronic component is coupled to the conductive structure adjacent to the substrate first side. An encapsulant is over the substrate first side, the exterior surface of the pipe wall and over at least a portion of the first electronic component. The pipe passage and the substrate opening are devoid of the encapsulant.

In an example, an electronic device includes a substrate comprising a first side, a conductive structure, and a substrate opening extending through the substrate. A first electronic component is coupled to the conductive structure adjacent to the first side. A pipe comprising a pipe top and a pipe passage is positioned over the substrate opening. An encapsulant covers at least portions of the first side, at least a portion of the first electronic component, and a portion of the pipe and comprising an upper side. The pipe top is exposed from the upper side of the encapsulant, and the pipe passage and the substrate opening are devoid of the encapsulant.

In an example, a method of manufacturing an electronic device includes providing a substrate, which includes a substrate first side, a substrate second side opposite to the substrate first side, a conductive structure, and a substrate opening extending through the substrate from the substrate first side to the substrate second side. The method includes providing a pipe comprising a pipe wall including an exterior surface and an interior surface defining a pipe passage. The method includes coupling the pipe to the substrate first side with the pipe passage positioned over the substrate opening. The method includes coupling a first electronic component to the conductive structure adjacent substrate first side. The method includes providing an encapsulant over the substrate first side, the exterior surface of the pipe wall and over at least a portion of the first electronic component and comprising an upper side. The method provides the pipe passage exposed from the upper side of the encapsulant, the interior surface of the pipe wall and the substrate opening devoid of the encapsulant, and the pipe passage and the substrate opening forming a continuous passage from the substrate second side to the upper side of the encapsulant.

Other examples are included in the present disclosure. Such examples may be found in the figures, in the claims, and/or in the description of the present disclosure.

FIG. 1 shows a cross-sectional view of electronic device 10. In the example of FIG. 1, electronic device 10 can comprise substrate 11, electronic components 12, 13, and 14, pipe 15, encapsulant 16, and external interconnects 18.

Substrate 11 can comprise dielectric structure 111 and conductive structure 112. Conductive structure 112 can comprise internal terminals 112$i$ and external terminals 112$e$. Substrate 11 can comprise substrate openings 115. Substrate openings 115 can extend completely through substrate 11 (e.g., substrate openings 115 can extend from an upper surface of substrate 11 to an opposing lower surface of substrate 11). Electronic components 12, 13, and 14 can comprise component interconnects 12$a$, 13$a$, and 14$a$, respectively. In some examples, electronic component 14 can comprise lid 14$b$. Pipe 15 can comprise pipe passage 15P. Pipe passage 15P can extend completely through pipe 15 (e.g., pipe passage 15P can extend from an upper surface or side of pipe 15 to an opposing lower surface or side of pipe 15). Pipe passage 15P can overlap and be vertically aligned with substrate opening 115. In some examples, pipe passage 15P can be aligned with or substantially aligned with substrate opening 115.

Substrate 11, pipe 15, encapsulant 16, and external interconnects 18 can comprise or be referred to as electronic package 101 or package 101. Electronic package 101 can protect electronic components 12, 13, and 14 from exposure to external elements or environments. Electronic package 101 can also provide electrical coupling between electronic components 12, 13, and 14 and between electronic components 12, 13, and 14 and external components or other electronic packages.

FIGS. 2A to 2E show cross-sectional views of an example method for manufacturing example electronic device 10.

Figures 2A, 2B:
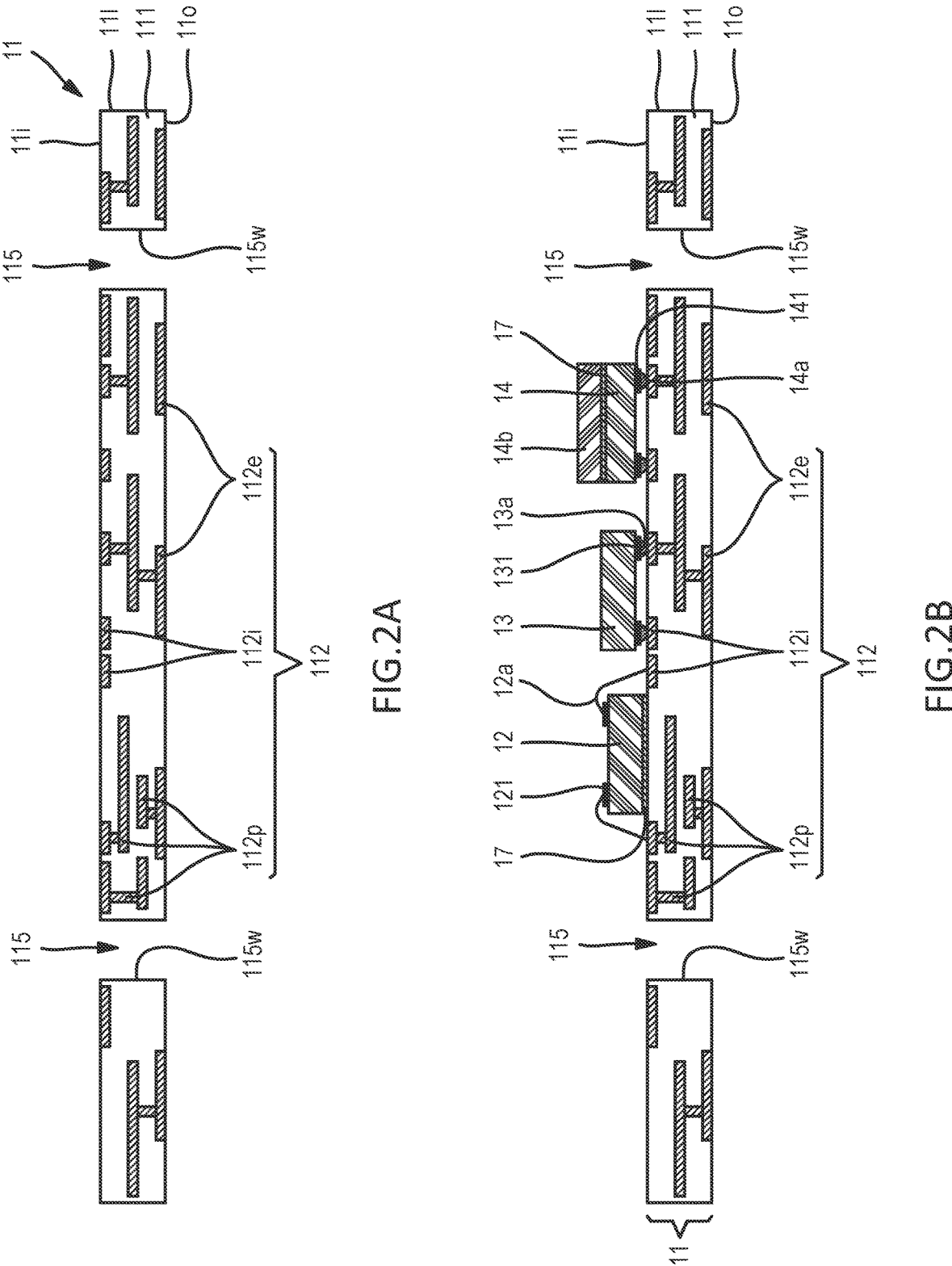

FIG. 2A shows a cross-sectional view of electronic device 10 at an early stage of manufacture. In the example shown in FIG. 2A, substrate 11 can be provided and can comprise dielectric structure 111 and conductive structure 112.

In some examples, dielectric structure 111 can comprise or be referred to as one or more stacked dielectric layers. For instance, the one or more dielectric layers can comprise, one or more core layers, polymer layers, pre-preg layers, or solder mask layers stacked on each other. One or more layers or elements of conductive structure 112 can be interleaved with the dielectric layers of dielectric structure 111. The upper and lower sides of dielectric structure 111 can be part of or form substrate inner side 11$i$ and substrate outer side 11$o$ of substrate 11, respectively. Substrate outer side 11$o$ can be opposite substrate inner side 11$i$. Substrate 11 can have substrate lateral side 11$l$. Substrate lateral side 11$l$ can extend from substrate inner side 11$i$ to substrate outer side 11$o$. That is, substrate lateral side 11$l$ connects substrate inner side 11$i$ to substrate outer side 11$o$. Substrate inner side 11$i$ can also be referred to as a substrate first side or a substrate top side, and substrate outer side 11$o$ can be referred to as a substrate second side or a substrate bottom side. In some examples, dielectric structure 111 can comprise an epoxy resin, a phenolic resin, a glass epoxy, a polyimide, a polyester, an epoxy molding compound, or a ceramic. In some examples, the thickness of dielectric structure 111, as measured between substrate inner side 11$i$ and substrate outer side 11$o$, can range from approximately 10 micrometers ($\mu$m) to 500 $\mu$m.

Conductive structure 112 can comprise one or more conductive layers and defines conductive paths within substrate 11. Conductive structure 112 can comprise or be referred to as traces, pads, vias, or wiring patterns. Conductive structure 112 can comprise internal terminals 112$i$ provided on substrate inner side 11$i$, external terminals 112$e$ provided on substrate outer side 11$o$, and conductive paths 112$p$ extending through dielectric structure 111 and between internal terminals 112$i$ and external terminals 112$e$.

Internal terminals 112$i$ and external terminals 112$e$ can be provided, respectively, on substrate inner side 11$i$ and substrate outer side 11$o$ in a matrix form having rows or columns. In some examples, internal terminals 112$i$ or external terminals 112$e$ can comprise or be referred to as a conductor, a conductive material, a substrate land, a conductive land, a substrate pad, a wiring pad, a connection pad, a micro pad, or under-bump-metallurgy (UBM). In some examples, the thicknesses of each of internal terminals 112$i$ and external terminals 112$e$ can range from approximately 10 $\mu$m to 100 $\mu$m.

Conductive paths 112$p$ can be formed in dielectric structure 111 to couple internal terminals 112$i$ with external terminals 112$e$. Conductive paths 112$p$ can be formed of one or more conductive layers. In some examples, conductive paths 112$p$ can comprise or be referred to as one or more conductors, conductive material, vias, circuit patterns, traces, or wiring patterns. Conductive paths 112$p$ can extend in a generally horizontal and in a generally vertical direction through dielectric structure 111. In some examples, internal terminals 112$i$, external terminals 112$e$, and conductive paths 112$p$ can comprise copper, iron, nickel, gold, silver, palladium, or tin.

Substrate 11 can comprise substrate opening 115. Substrate opening 115 can extend from inner side 11$i$ to outer side 110 of substrate 11. In some examples, substrate opening 115 can comprise or be referred to as a hole or hollow via. One or more substrate openings 115 can be provided in substrate 11 with the substrate openings 115 spaced apart from one other. Substrate opening 115 can be defined by opening sidewall 115$w$, which may be generally parallel to substrate lateral side 11$l$ or generally perpendicular to inner side 11$i$ or outer side 110 of substrate 11. In some examples, substrate opening 115 can have a generally cylindrical shape (e.g., substrate opening 115 can have a circular cross-sectional shape). While described as cylindrical, it is further contemplated and understood that, in some examples, substrate opening 115 can have other shapes (e.g., frustoconical, cuboid, triangular prism, etc.). In some examples, substrate opening 115 can be provided by partially removing substrate 11 by a laser beam or etching method. In some examples, the diameter (or width) of substrate opening 115 can range from approximately 1.0 millimeters (mm) to approximately 10.0 mm.

In some examples, substrate 11 can comprise or be referred to as a laminate substrate, a ceramic substrate, a rigid substrate, a glass substrate, a silicon substrate, a printed circuit board, a multilayer substrate, or a molded lead frame. In some examples, substrate 11 can comprise or be referred to as a redistribution layer (RDL) substrate, a buildup substrate, or a coreless substrate. In some examples, an area or "footprint" of substrate 11 can be selected according to the footprint or number of electronic components 12, 13 and, 14 supported by substrate 11. In some examples, substrate 11 can have an area of about 8 mm×8 mm to about 150 mm×150 mm. In some examples, substrate 11 can have a thickness of about 0.2 mm to about 4.0 mm.

In some examples, substrate 11 can be an RDL substrate. RDL substrates can comprise one or more conductive redistribution layers and one or more dielectric layers and (a) can be formed layer by layer over an electronic device to which the RDL substrate is to be coupled, or (b) can be formed layer by layer over a carrier and then entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride (Si3N4), silicon oxide (SiO2), or silicon oxynitride (SiON). The inorganic dielectric layer(s) can be formed by growing the inorganic dielectric layers using an oxidation or nitridization process rather than using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Substrates, as disclosed herein, can comprise RDL substrates.

In some examples, substrate 11 can be a pre-formed substrate. Pre-formed substrate can be manufactured prior to attachment to an electronic device and can comprise dielectric layers between respective conductive layers. The conductive layers can comprise, for example, copper and can be formed using an electroplating process. The dielectric layers can be non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrates can be formed through a semi-additive or modified-semi-additive process. Substrates, as disclosed herein, can comprise pre-formed substrates.

FIG. 2B shows a cross-sectional view of electronic device 10 at a later stage of manufacture. In the example shown in FIG. 2B, one or more electronic component(s) 12, 13, and 14 can be provided on substrate 11. Electronic components 12, 13, and 14 can be coupled to internal terminals 112i of substrate 11.

In some examples, pick-and-place equipment can pick up electronic components 12, 13, and 14 and place electronic components 12, 13, and 14 on inner side 11i of substrate 11. Then, electronic components 12, 13, and 14 can be coupled to substrate 11 through mass reflow, thermocompression bonding, or laser assisted bonding processes.

In some examples, electronic components 12, 13, and 14 can each comprise or be referred to as a semiconductor die, a semiconductor chip, a semiconductor package, an active component, or a passive component, such as a land-side capacitor (LSC). Electronic components 12, 13, and 14 can comprise component terminals 121, 131, and 141, respectively. Component terminals 121, 131, and 141 can be provided on the upper or lower surfaces of electronic components 12, 13, and 14, respectively. In some examples, component terminals 121, 131, and 141 can comprise or be referred to as micro pads, component pads, or bond pads. Component terminals 121, 131, and 141 can be input/output terminals of electronic components 12, 13, and 14, respectively. In some examples, the thickness of each of component terminals 121, 131, and 141 can range from approximately 10 μm to approximately 70 μm.

Each of electronic components 12, 13, and 14 can include an active region and a non-active region. In some examples, the active region of electronic component 12 can be provided on the top surface of electronic component 12 (e.g., on the surface oriented away from substrate 11), and a non-active region of electronic component 12 can be oriented toward and bonded to substrate 11. In some examples, component terminals 121 can be positioned over the active region of electronic component 12. Electronic component 12 can comprise or be referred to as a face-up or wire-bonded component. The lower side of electronic component 12 can be bonded to inner side 11i of substrate 11 through interface material 17. In some examples, interface material 17 can include solder, an adhesive layer, or an adhesive film. In some examples, interface material 17 can be coated on inner side 11i of substrate 11 by a coating method, such as spin coating, doctor blade, casting, painting, spray coating, slot die coating, curtain coating, slide coating or knife-over edge coating; a printing method, such as screen printing, pad printing, gravure printing, flexography printing or offset printing; an inkjet printing method such as a technology intermediate between coating and printing; or direct attachment of an adhesive film or adhesive tape. Electronic component 12 can comprise component interconnects 12a. Component terminal 121 can be coupled to internal terminals 112i of substrate 11 through component interconnects 12a. Component interconnects 12a can each comprise or be referred to as a conductive wire. For example, the conductive wire can be a conductive wire, such as a gold wire, a copper wire, or an aluminum wire, and can electrically connect component terminal 121 to internal terminal 112i of substrate 110. In some examples, the thickness (or diameter) of component interconnect 12a can range from approximately 10 μm to approximately 500 μm.

In some examples, electronic components 13 and 14 can each have a non-active region on the respective upper surface (i.e., the surface oriented away from substrate 11) and an active region on the respective lower surface (i.e., the surface oriented toward substrate 11). In some examples, component terminals 131 and 141 can be positioned over the active region on the lower surfaces of electronic components 13 and 14. Electronic components 13 and 14 can comprise or be referred to as face-down or flip chips. Electronic components 13 and 14 can comprise component interconnects 13a and 14a, respectively. Component terminals 131 and 141 can be coupled to internal terminals 112i of substrate 11 through component interconnects 13a and 14a, respectively. Component interconnects 13a and 14a can be interposed between component terminals 131 and 141 and internal terminal 112i of substrate 11, respectively. In some examples, component interconnects 13a and 14a can comprise or be referred to as bumps, pillars, conductive posts, or solder balls. For example, component interconnects 13a and 14a can include a metallic, electrically conductive material such as aluminum, copper, an aluminum alloy, a copper alloy, or gold. In some examples, component interconnects 13a and 14a can include low melting point materials. For example, the low melting point materials can include any one of Sn, Ag, Pb, Cu, Sn—Pb, Sn37-Pb, Sn95-Pb, Sn—Pb—Ag, Sn—Cu, Sn—Ag, Sn—Au, Sn—Bi, and Sn—Ag—Cu. The low-melting-point material of component interconnects 13a and 14a can be melted through a reflow process to electrically connect component terminals 131 and 141 to internal terminals 112i, respectively. In some examples, thermocompression bonding or laser assisted bonding may be employed to couple component interconnects 13a and 14a to internal terminals 112i. In some examples, the thickness of component interconnects 13a and 14a can range from approximately 10 μm to approximately 100 μm.

In some examples, electronic component 14 can comprise lid 14b. Lid 14b can be located over and can cover the upper surface of electronic component 14. In some examples, lid 14b can be referred to as a plate, a workpiece, or a heatsink. In some examples, electronic component 14 can comprise or be referred to as a power semiconductor component. Lid 14b can be coupled to the upper side of electronic component 14 by interface material 17. In some examples, lid 14b can be made of a metal or ceramic having high thermal conductivity and radiation. In some examples, lid 14b can include aluminum or copper. In some examples, lid 14b can comprise or be referred to as a heat sink, a heat spreader, direct bonded copper (DBC), or active metal brazing (AMB). Lid 14b can easily dissipate heat generated by the electronic component 14. In some examples, lid 14b can be incorporated into electronic component 14.

In some examples, the area of each of electronic component 12 and electronic component 13 can range from approximately 0.5 mm×0.5 mm to approximately 20 mm×20 mm, and the overall thickness of each of electronic component 12 and electronic component 13 can range from approximately 20 μm to approximately 800 μm. In some examples, the area of electronic component 14 can range from approximately 0.5 mm×0.5 mm to approximately 150 mm×150 mm. In some examples, the overall thickness of electronic component 14 can range from approximately 0.25 mm to approximately 4.8 mm.

FIG. 2C shows a cross-sectional view of electronic device 10 at a later stage of manufacture. FIG. 2C-A shows a transparent perspective view of pipe 15 of electronic device 10, as shown in FIG. 2C. In the example of FIGS. 2C and 2C-A, pipe 15 can be seated on and coupled to inner side 11i of substrate 11. Pipe 15 can comprise pipe ceiling 15c and pipe wall 15w extending from the edge of pipe ceiling 15c toward substrate 11. In some examples, pipe ceiling 15c can be a circular plate. Pipe 15 can have pipe passage 15P at the center. An interior surface 15i of pipe wall 15w can define pipe passage 15P. In some examples, the thickness of pipe wall 15w, as measured between interior surface 15i and exterior surface 15e of pipe wall 15w, can be substantially uniform. Pipe passage 15p can be an empty space that is devoid of material. Pipe wall 15w can have form a circular ring on the lower surface of pipe 15. Pipe 15 can be positioned over and aligned with substrate passage 115. In some examples, pipe 15 can be referred to as a cup or cap. In some examples, pipe 15 comprises a conductor or a conductive material. In some examples, the conductive material can be thermally conductive and electrically insulating. In some examples, the conductive material can be thermally and electrically conductive. In some examples, the inner diameter of pipe 15 is substantially equal to the diameter of substrate opening 115. In some examples, the inner diameter of pipe 15 can be different (i.e., larger, or smaller) than the diameter of substrate opening 115 to accommodate differ types of attachment structures. In some examples the diameter of pipe 15 is greater than the diameter of substrate opening 115 to compensate for process variability when pipe 15 is attached to substrate 11. In some examples, a coating can be provided on interior surface 15i. In some examples, the coating can comprise an electrically insulating material that is thermally conductive. In some examples, the coating can comprise a conductive material.

In some examples, the coating can comprise a material configured to reduce or absorb stress, such as stress imparted to electronic device 10 by an attachment structure. In some examples, exterior surface 15e can be provided with a coating, a roughened texture, or with other structures configured to enhance adhesion with encapsulant 16.

Pipe 15 can be coupled to inner side 11i of substrate 11 through interface material 17. In some examples, interface material 17 can comprise solder, and pipe 15 can be coupled to one or more inner terminal(s) 112i of substrate 11 through interface material 17. In some examples, one or more inner terminal(s) 112i coupled to pipe 15 can comprise ground terminal(s). In some examples, interface material 17 can comprise an adhesive layer or an adhesive film, and the lower surface of pipe 15 can be coupled to inner side 11i of substrate 11 (e.g., to dielectric structure 111) through interface material 17.

In some examples, pick-and-place equipment can pick up pipe 15 and locate pipe 15 on substrate inner side 11i, such that pipe passage 15p is aligned with substrate passage 115. Subsequently, pipe 15 can be coupled to substrate 11 through a mass reflow, thermocompression, or laser assisted bonding process. The lower surface of pipe wall 15w can be coupled to the portion of substrate inner side 11i that is adjacent substrate opening 115 and with pipe passage 15P vertically aligned with substrate opening 115. Pipe passage 15P can extend upwardly from substrate opening 115. In some examples, the diameter of pipe passage 15P can be equal, or approximately equal, to the diameter to substrate opening 115. In some examples, pipe 15 and electronic components 12, 13, 14 can be placed during the same pick-and-place step and subjected to the mass reflow, thermocompression, or laser assisted bonding process at the same time.

In some examples, the overall height of pipe 15 can range from approximately 0.25 mm to approximately 5.8 mm. In some examples, the thickness of pipe ceiling 15c can range from approximately 0.1 mm to approximately 1.0 mm. In some examples, the thickness of pipe wall 15w can range from 0.5 mm to 2.0 mm. In some examples, the diameter of pipe passage 15P can be in a range of 1.0 mm to 10.0 mm, and an outer diameter of pipe 15, as measured at the exterior surface 15e of pipe wall 15w, can be in a range of 2.0 mm to 14.0 mm.

Figures 2D, 2E:
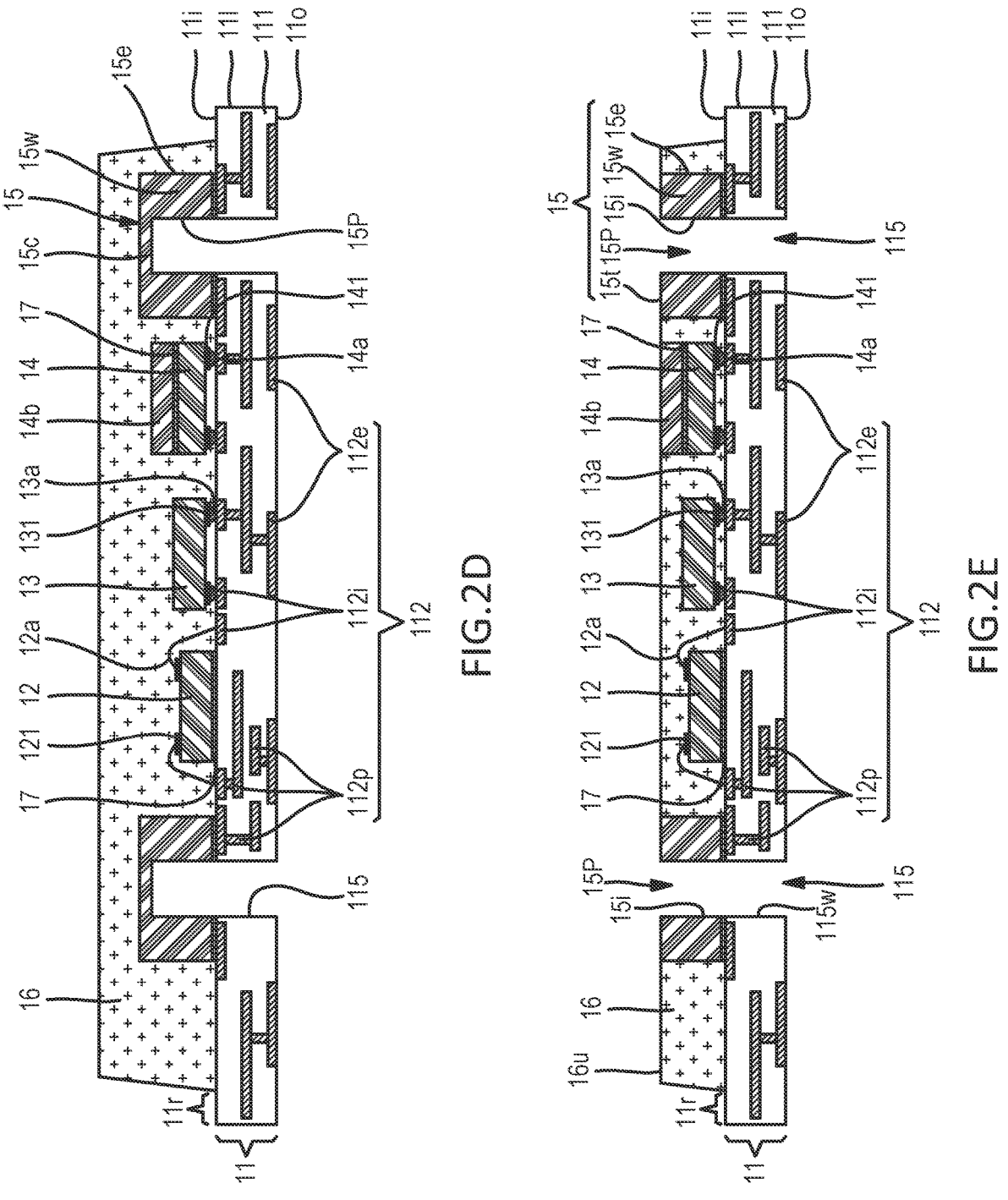

FIG. 2D shows a cross-sectional view of electronic device 10 at a later stage of manufacture. In the example of FIG. 2D, encapsulant 16 is provided over and can cover substrate 11, electronic components 12, 13, and 14, and pipe 15. Encapsulant 130 can contact inner side 11i of substrate 11 and the upper surfaces and lateral sides of electronic components 12, 13, and 14. Encapsulant 130 can contact the exterior surface 15e of pipe wall 15w of pipe 15 and the upper surface of pipe ceiling 15c. 15w-Substrate opening 115 and pipe passage 15p can maintain an empty hollow state (i.e., are devoid of encapsulant 16). In some examples, an edge region 11r of inner side 11i of substrate 11 can be exposed from encapsulant 16. In some examples, encapsulant 16 can comprise or be referred to as a body or mold compound. In some examples, encapsulant 16 can include an organic resin, an inorganic filler, a curing agent, a catalyst, a coupling agent, a colorant, or a flame retardant, and can be formed by compression molding, transfer molding, liquid body molding, vacuum lamination, paste printing, or an assist molding method. In some examples, the thickness of encapsulant 16 can range from approximately 0.25 mm to approximately 5.8 mm. Encapsulant 16 can protect electronic components 12, 13, and 14 from external elements and can provide or increase the structural integrity of substrate 11 or electronic device 10. In some examples, encapsulant 16 and pipe 15 comprise different materials. That is, in some examples encapsulant 16 and pipe 15 are distinct and different structures, which are not integral with each other.

FIG. 2E shows a cross-sectional view of electronic device 100 at a later stage of manufacture. In the example of FIG. 2E, the upper portion of encapsulant 16 and pipe ceiling 15c of pipe 15 can be removed. In some examples, encapsulant 16 and pipe ceiling 15c can be removed by grinding or chemical etching. After removal of pipe ceiling 15c, pipe top 15t may be formed by the upper surface of pipe wall 15w. Pipe top 15t can be exposed at or from upper side 16u of encapsulant 16. In some examples, upper side 16u of encapsulant 16 and pipe top 15t can be coplanar. Removal of pipe ceiling 15c can allow pipe passage 15p to extend completely through pipe 15. Removal of pipe ceiling 15c creates a continuous passage, via pipe passage 15P and substrate opening 115, between upper side 16u of encapsulant 16 and outer side 11o of substrate 11. For example, substrate opening 115 and pipe passage 15p can together extend continuously from outer side 11o of substrate 11 to upper side 16u of encapsulant 16. Because of the removal process, in some examples the surface texture of pipe 15 along pipe top 15t can be different than the texture of other parts of pipe 15, such as interior surface 15i or exterior surface 15e.

In some examples, lid 14b of electronic component 14 can be exposed at the upper side of encapsulant 16. Exposed lid 14b can increase or improve heat dissipation from electronic component 14. In some examples, the thickness of encapsulant 16 can range from approximately 0.15 mm to approximately 4.8 mm.

Figure 2F:
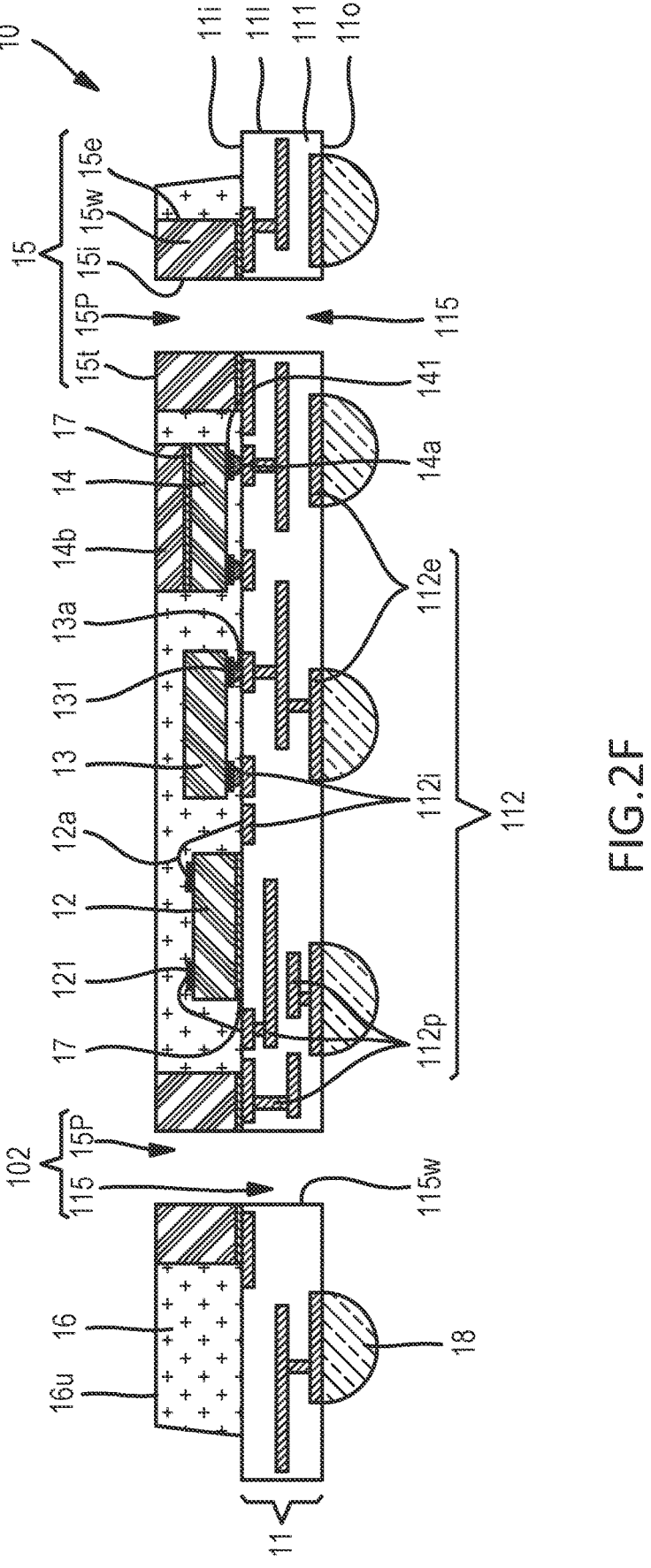

FIG. 2F shows a cross-sectional view of electronic device 10 at a later stage of manufacture. In the example of FIG. 2F, external interconnects 18 can be provided and coupled to external terminals 112o of substrate 11.

External interconnects 18 can be coupled to electronic components 12, 13, and 14 through conductive structure 112 of substrate 11. Electronic components 12, 13, and 14 can be coupled to each other through substrate 11 and/or can be coupled to external components via external interconnects 18. In some examples, external interconnect 18 can comprise or be referred to as a pillar, a solder tip, a bump, or a solder ball. In some examples, external interconnects 18 can include tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 18 can be formed through a reflow process after forming a conductive material containing solder on external terminals 1120 of substrate 11 through a ball drop method. External interconnect 18 can comprise or be referred to as a conductive ball, such as a solder ball, a conductive pillar, such as a copper pillar, or a conductive post with a solder cap formed over the copper pillar. In some examples, the size of each external interconnect 18 can range from approximately 0.5 mm to approximately 1.5 mm. In some examples, external interconnects 18 can comprise or be referred to as an external input/output terminals of electronic device 10.

In accordance with various examples, electronic device 10 can comprise substrate 11, electronic components 12, 13, and 14, pipe 15, encapsulant 16, and external interconnects 18. Electronic device 10 can comprise passage 102 including substrate opening 115 and pipe passage 15p and penetrating from the upper surface to the lower surface of electronic device 10 by. Electronic device 10 comprising passage 102 can be easily installed and fixed by fixing means, such as a screw, rivet, or pin, extending through passage 102. In some examples, electronic device 10 can comprise or be referred to as a power supply device.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claimed is:

1. An electronic device, comprising:

a substrate comprising:
    a substrate first side;
    a substrate second side opposite to the substrate first side;
    a conductive structure; and
    a substrate opening extending through the substrate from the substrate first side to the substrate second side;

a pipe coupled to the substrate first side and comprising:
    a pipe wall including an exterior surface and an interior surface defining a pipe passage aligned with the substrate opening; and
    a pipe top distal to the substrate first side;

a first electronic component coupled to the conductive structure adjacent to the substrate first side; and an encapsulant covering the substrate first side, the exterior surface of the pipe wall and covering at least a portion of the first electronic component;

wherein:
    the pipe is external to and above the substrate opening at the substrate first side;
    the pipe passage and the substrate opening are devoid of the encapsulant;
    the encapsulant comprises an upper side;
    the pipe passage and the substrate opening form a continuous passage from the substrate second side to the upper side of the encapsulant;
    the substrate comprises a substrate lateral side connecting the substrate first side to the substrate second side; and
    the pipe is laterally inset from the substrate lateral side so that a portion of the substrate first side extends between the exterior surface of the pipe wall and the substrate lateral side.

2. The electronic device of claim 1, wherein:
the continuous passage is an enclosed passage; and
the continuous passage is configured for receiving a mechanical fastener.

3. The electronic device of claim 1, wherein:
the pipe top and the upper side of the encapsulant are coplanar; and
the pipe top comprises a surface texture different than that of the interior surface of the pipe.

4. The electronic device of claim 1, further comprising:
a coating comprising a non-electrically conducting material on the interior surface of the pipe wall;
wherein:
the pipe comprises an electrically conductive material.

5. The electronic device of claim 1, wherein:
the first electronic component comprises:
    a component first side coupled to the substrate first side;

a component second side opposite to the component first side; and
    a lid coupled to the component second side;
the encapsulant comprises an upper side distal to the substrate first side; and
the lid comprises a lid top side that is exposed from the upper side of the encapsulant.

6. The electronic device of claim 5, wherein:
the lid comprises a thermally conductive material; and
the lid top side, the pipe top, and the upper side of the encapsulant are coplanar.

7. The electronic device of claim 1, further comprising:
a second electronic component coupled to the substrate first and coupled to the conductive structure;
wherein:
    the encapsulant covers the second electronic component.

8. The electronic device of claim 1, wherein:
the encapsulant contacts the exterior surface of the pipe wall; and
the pipe top is devoid of the encapsulant.

9. The electronic device of claim 1, wherein:
the pipe passage comprises a first diameter;
the substrate opening comprises a second diameter; and
the first diameter is larger than the second diameter.

10. The electronic device of claim 1, wherein:
the pipe is coupled to the conductive structure.

11. An electronic device, comprising:
a substrate comprising a first side, a second side opposite the first side, a lateral side connecting the first side to the second side, a conductive structure, and a substrate opening extending through the substrate;
a first electronic component coupled to the conductive structure adjacent to the first side;
a pipe comprising a pipe top and a pipe wall defining a pipe passage positioned over the substrate opening;
an encapsulant covering at least portions of the first side, at least a portion of the first electronic component, and a portion of the pipe and comprising an upper side;
wherein:
the substrate opening is defined by an opening sidewall;
the pipe is external to and above the substrate opening at the first side of the substrate;
the pipe passage and the substrate opening form a continuous passage enclosed by the pipe wall and the opening sidewall;
the continuous passage extends from the second side of the substrate to the upper side of the encapsulant;
the pipe top is exposed from the upper side of the encapsulant;
the pipe passage and the substrate opening are devoid of the encapsulant;
the pipe is laterally inset from the lateral side of the substrate so that a portion of the first side extends between the pipe wall and the lateral side of the substrate; and
the continuous passage is configured for receiving a mechanical fastener.

12. The electronic device of claim 11, wherein:
the first electronic component comprises a component first side proximate to the first side of the substrate and a component second side distal to the first side of the substrate; and
the component second side is exposed from the upper side of the encapsulant.

13. The electronic device of claim 11, wherein:

the pipe comprises a conductive material; and the pipe is coupled to the conductive structure.

14. The electronic device of claim 11, further comprising:

a second electronic component coupled to the conductive structure adjacent to the first side;

wherein:

the encapsulant covers the second electronic component;

a portion of the first electronic component is exposed from the upper side of the encapsulant; and the upper side of the encapsulant, the pipe top, and the portion of the first electronic component are coplanar.

15. The electronic device of claim 11, wherein:

the pipe and the encapsulant comprise different materials.

16. The electronic device of claim 11, wherein:

the pipe comprises an interior surface; and the pipe top comprises a different surface texture than that of the interior surface.

17. A method of manufacturing an electronic device, comprising:

providing a substrate comprising:

a substrate first side;

a substrate second side opposite to the substrate first side;

a substrate lateral side connecting the substrate first side to the substrate second side;

a conductive structure; and a substrate opening defined by an opening sidewall in the substrate and extending through the substrate from the substrate first side to the substrate second side;

providing a pipe comprising a pipe wall including an exterior surface and an interior surface defining a pipe passage;

coupling the pipe at the substrate first side with the pipe passage positioned external to, above, and aligned with the substrate opening;

coupling a first electronic component to the conductive structure adjacent to the substrate first side; and providing an encapsulant over the substrate first side, the exterior surface of the pipe wall and over at least a portion of the first electronic component and comprising an upper side;

wherein:

the pipe passage is exposed from the upper side of the encapsulant;

the interior surface of the pipe wall and the substrate opening are devoid of the encapsulant;

the pipe passage and the substrate opening form a continuous passage from the substrate second side to the upper side of the encapsulant;

the continuous passage is enclosed by the interior surface of the pipe and the opening sidewall in the substrate;

the pipe is external to and above the substrate opening at the substrate first side;

the pipe is laterally inset from the substrate lateral side so that portion of the substrate first side extends between the exterior surface of the pipe wall and the substrate lateral side; and the continuous passage is configured for receiving a mechanical fastener.

18. The method of claim 17, wherein:

providing the pipe comprises providing a pipe ceiling at an upper portion of the pipe and covering the pipe passage; and after providing the encapsulant, the method further comprises:

removing an outer portion encapsulant and the pipe ceiling to form the upper side of the encapsulant and to expose the pipe passage, wherein the continuous passage is configured for receiving a mechanical fixing structure.

19. The method of claim 17, wherein:

coupling the first electronic component comprises:

providing the first electronic component comprises providing the first electronic component including a component first side, a component second side opposite to the component first side, and a lid coupled to the component second side; and coupling the component first side to the conductive structure so that the lid is distal to the substrate first side; and providing the encapsulant comprises exposing the lid from the upper side of the encapsulant.

20. The method of claim 17, wherein:

providing the pipe comprises providing the pipe comprising an electrically conductive material and providing a non-electrically conductive coating on the interior surface of the pipe.

* * * * *